(12) United States Patent
Behrends et al.

(10) Patent No.: US 8,427,894 B2
(45) Date of Patent: Apr. 23, 2013

(54) IMPLEMENTING SINGLE BIT REDUNDANCY FOR DYNAMIC SRAM CIRCUIT WITH ANY BIT DECODE

(75) Inventors: Derick G. Behrends, Rochester, MN (US); Todd A. Christensen, Rochester, MN (US); Peter T. Freiburger, Rochester, MN (US); Travis R. Hebig, Rochester, MN (US); Jayson K. Wittrup, East Grand Forks, MN (US)

(73) Assignee: International Business Machines Corporation, Armonk, NY (US)

( * ) Notice: Subject to any disclaimer, the term of this patent is extended or adjusted under 35 U.S.C. 154(b) by 267 days.

(21) Appl. No.: 12/886,692

(22) Filed: Sep. 21, 2010

(65) Prior Publication Data
US 2012/0069688 A1    Mar. 22, 2012

(51) Int. Cl.
*G11C 29/04*    (2006.01)
*G06F 17/50*    (2006.01)

(52) U.S. Cl.
USPC .......................................... 365/200; 716/136

(58) Field of Classification Search .................. None
See application file for complete search history.

(56) References Cited

U.S. PATENT DOCUMENTS 7,443,744 B2   10/2008  Behrends et al.
2008/0112237 A1*  5/2008  Behrends et al. ............. 365/200

* cited by examiner

*Primary Examiner* — Hoai V Ho
*Assistant Examiner* — James G Norman
(74) *Attorney, Agent, or Firm* — Joan Pennington

(57) ABSTRACT

A method and a dynamic Static Random Access Memory (SRAM) circuit for implementing single bit redundancy with any bit decode, and a design structure on which the subject circuit resides are provided. The SRAM circuit includes a plurality of bitline columns and a pair of redundancy columns respectively coupled to a respective merged bit column select and redundancy steering multiplexer. Each merged bit column select and redundancy steering multiplexer receives a respective select signal input. A select signal generation circuit receives a redundancy steering signal and a respective one-hot bit select signal, generating the respective select signal input.

20 Claims, 6 Drawing Sheets

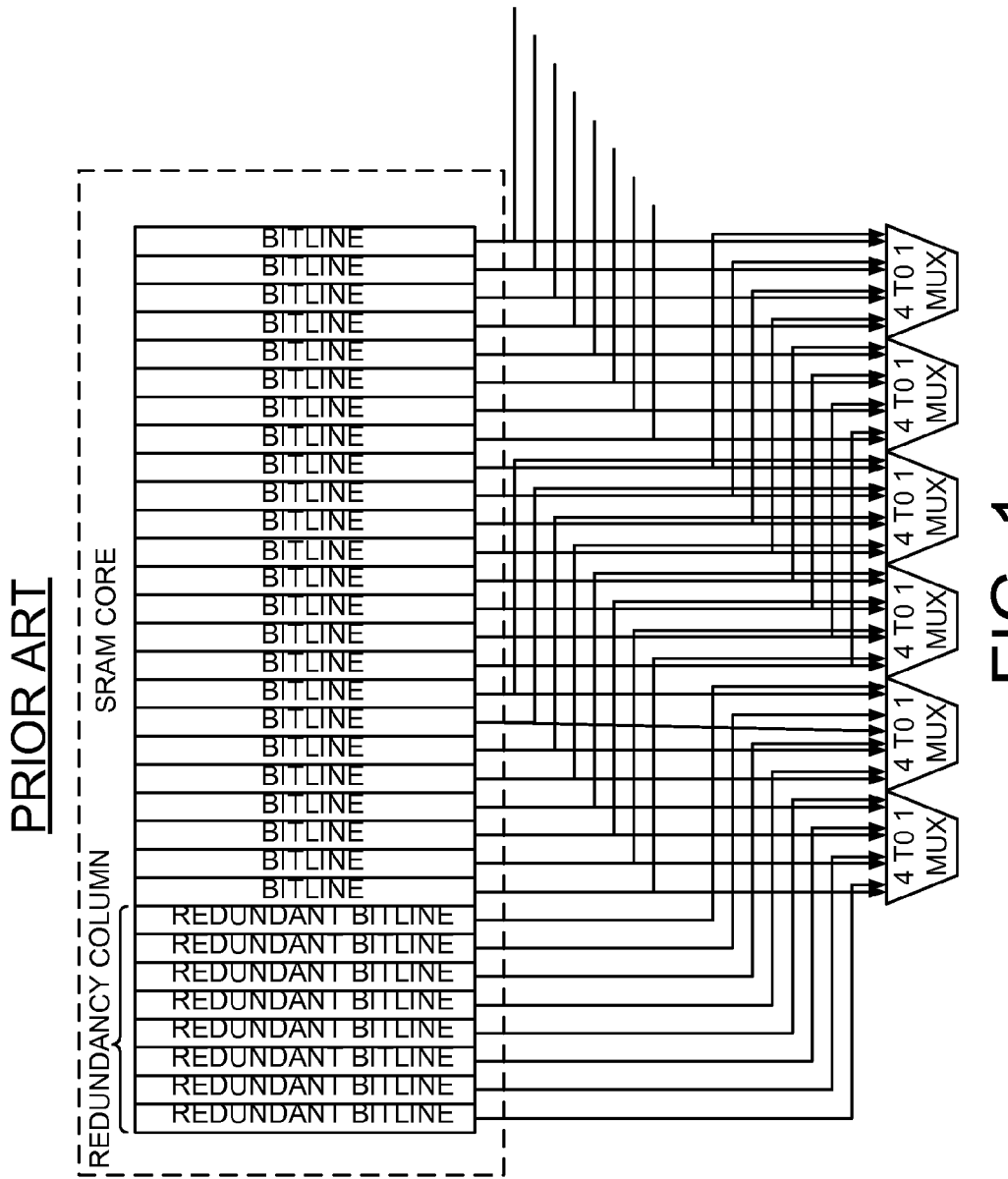

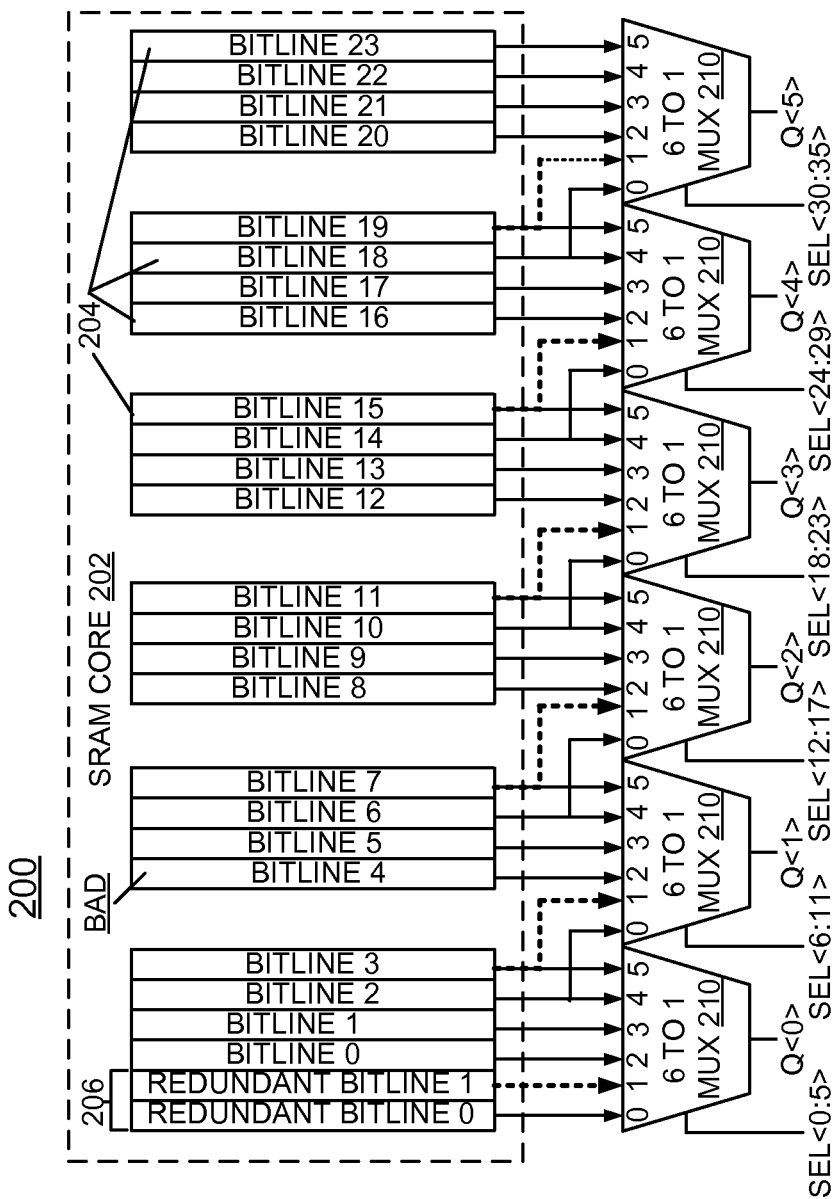

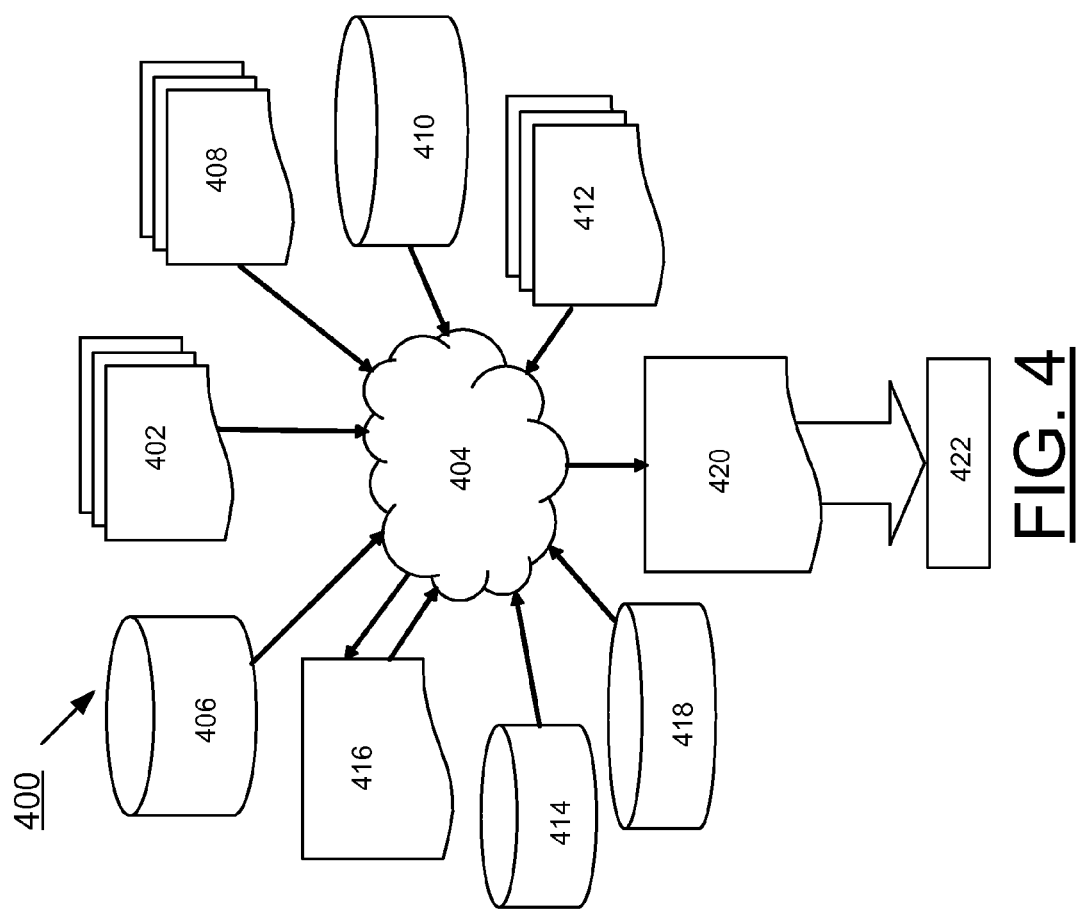

IMPLEMENTING SINGLE BIT REDUNDANCY FOR DYNAMIC SRAM CIRCUIT WITH ANY BIT DECODE

FIELD OF THE INVENTION

The present invention relates generally to the data processing field, and more particularly, relates to a method and circuit for implementing single bit redundancy for dynamic Static Random Access Memory (SRAM) circuit with any bit decode, and a design structure on which the subject circuit resides.

DESCRIPTION OF THE RELATED ART

In a typical domino read SRAM array design, with single bit-column redundancy, the total number of dynamic nets connected together to implement the bit decode and redundancy steering, for example, via transmission gate or NFET pulldown network, is equal to 2 times the bit decode. For redundancy, any bit-column can select its "normal" bit or its "redundant" bit and subsequently one out of N, typically 1, 2, or 4 bits will be selected for the output.

FIG. 1 illustrates a conventional prior art SRAM redundancy arrangement with an SRAM core including 24 bitlines 0-23, 4 to 1 (4:1) multiplexers (MUXs) which requires 8 redundant columns.

In the case of a 4-to-1 bit decode, the total number of dynamic nets connected together is 8 including 4 normal and 4 redundant columns. This is a straightforward solution; however, connecting 8 dynamic nets can create leakage and noise problems on each connected dynamic net and the resulting output net.

The more nets connected together, the greater the total capacitance of the resultant bitline which leads to slower rise and fall times. This can lead to performance loss in the case of N equal to 4 or greater.

It is desirable to reduce the number of dynamic nets being connected together at the output to reduce the overall capacitance.

A need exists for an enhanced SRAM circuit with a single bit redundancy arrangement for use with any bit decode.

SUMMARY OF THE INVENTION

Principal aspects of the present invention are to provide a method and circuit for implementing single bit redundancy for dynamic Static Random Access Memory (SRAM) circuit with any bit decode, and a design structure on which the subject circuit resides. Other important aspects of the present invention are to provide such method and circuit substantially without negative effect and that overcome many of the disadvantages of prior art arrangements.

In brief, a method and a dynamic Static Random Access Memory (SRAM) circuit for implementing single bit redundancy with any bit decode, and a design structure on which the subject circuit resides are provided. The SRAM circuit includes a plurality of bitline columns and a pair of redundancy columns respectively coupled to a respective merged bit column select and redundancy steering multiplexer. Each merged bit column select and redundancy steering multiplexer receives a respective select signal input. A select signal generation circuit receives a redundancy steering signal and a respective one-hot bit select signal, generating the respective select signal input.

In accordance with features of the invention, only the pair of redundancy columns is required, where the bit decode is a selected N to 1 multiplexer, where N is greater than 2.

In accordance with features of the invention, the redundancy steering signal and the respective one-hot bit select signal are external applied signals. The redundancy steering signal includes one ST signal per bitline column. For example, with bitline columns 0-23, then the redundancy steering signal includes ST<0:23>, and with a bad bitline column 4 being the column that needs to be steered around, ST<5:23> are 0s and ST<0:4> are 1s. The one-hot bit select signal includes, for example, BS<0:3> with a bit decode 4 implementation.

In accordance with features of the invention, the select signal generation circuit includes a plurality of decoders or demultiplexers, each receiving the redundancy steering signal ST to select a zero or a one, and the respective one-hot bit select signal. The plurality of decoders or demultiplexers include a 1:2 decoder or 1:2 demultiplexer.

BRIEF DESCRIPTION OF THE DRAWINGS

The present invention together with the above and other objects and advantages may best be understood from the following detailed description of the preferred embodiments of the invention illustrated in the drawings, wherein:

FIG. 1 illustrates a conventional prior art SRAM redundancy arrangement with 4:1 multiplexers (MUXs) which requires 8 redundant columns;

FIGS. 3A and 3B illustrate the exemplary SRAM circuit of FIGS. 2A and 2B showing an example steering operation in accordance with a preferred embodiment; and FIG. 4 is a flow diagram of a design process used in semiconductor design, manufacturing, and/or test.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one or more other features, integers, steps, operations, elements, components, and/or groups thereof.

In accordance with features of the invention, a method and a dynamic Static Random Access Memory (SRAM) circuit for implementing single bit redundancy with any bit decode, and a design structure on which the subject circuit resides are provided. The enhanced redundancy method and circuit limits the number of added dynamic redundancy connections to a bit decode multiplexer. For example, in the case of a 4 to 1 bit multiplexer, only 2 additional dynamic nets connected to the multiplexer are necessary, making 6 connections total instead of 8 connections typically required by prior art arrangements. This redundancy method and circuit only requires 2 additional redundancy connections regardless of how many bits wide the bit multiplexer is, assuming greater than 2.

Figure 2A:
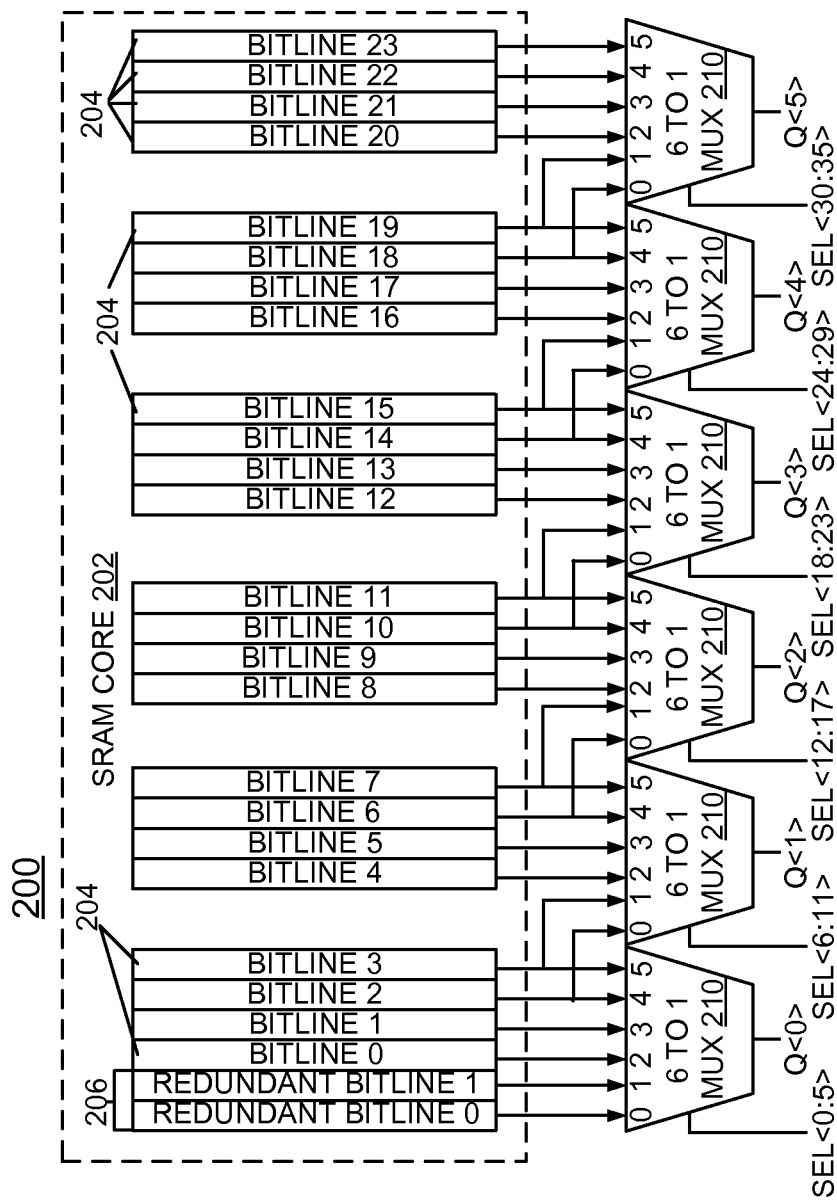
FIGS. 2A and 2B illustrate an exemplary SRAM circuit in accordance with a preferred embodiment.
Figure 2B:
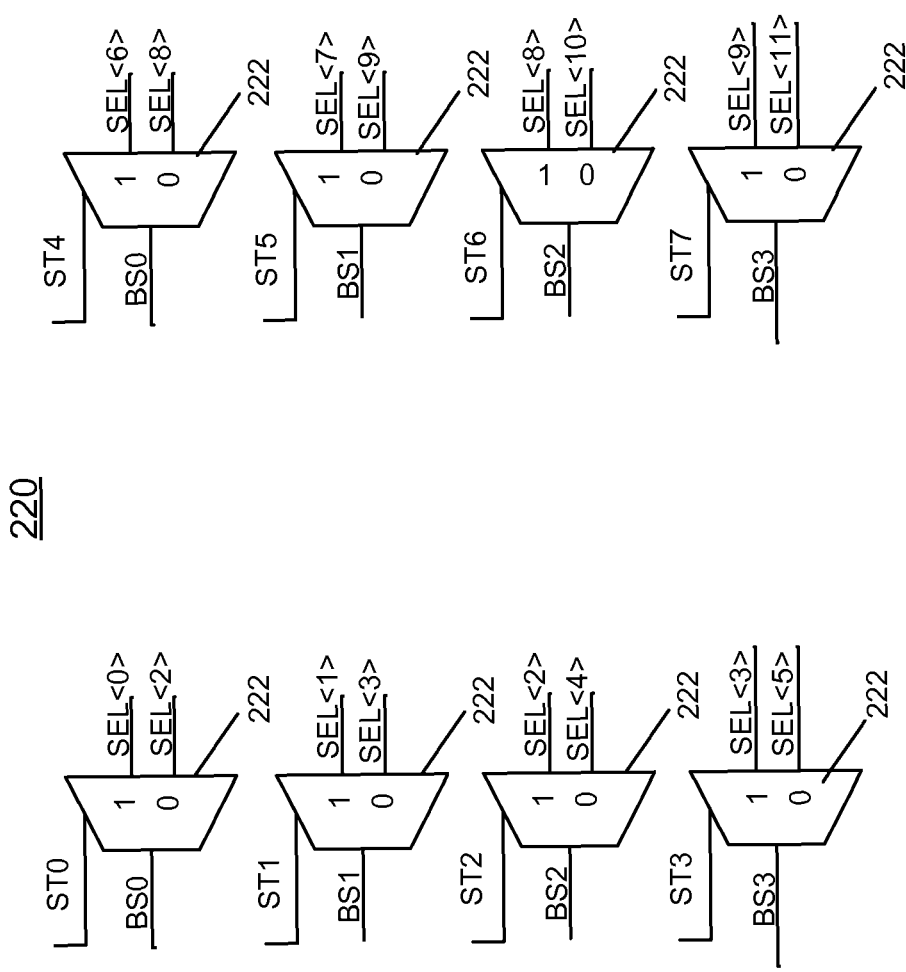

Having reference now to the drawings, in FIGS. 2A and 2B, there is shown an exemplary SRAM circuit respectively generally designated by the reference characters 200 in accordance with a preferred embodiment.

The dynamic SRAM circuit 200 includes a SRAM core 202 including a plurality of bitline columns 204, 0-23, and a pair of redundancy columns 206, 0 and 1, respectively coupled to a respective merged bit column select and redundancy steering multiplexer 210. Each merged bit column select and redundancy steering multiplexer 210 receives a respective select signal input provided by a select signal generation circuit 220. The select signal generation circuit 220 is used to generate the SEL signals based upon the values of the ST and BS signals. The SEL signals are then used to control the merged bit column select and redundancy steering multiplexer 210.

As shown, the merged bit column select and redundancy steering multiplexers 210 are 6 to 1 multiplexers. The select signal generation circuit 220 generates the SEL signals SEL<0:5>, SEL<6:11> for the first two 6 to 1 multiplexers 210, based upon the values of the ST and BS signals and the like for the remaining 6 to 1 multiplexers 210. The merged bit column select and redundancy steering multiplexers 210 can be implemented with any standard type of multiplexer. In many SRAMs, a pass gate multiplexer would be used to implement the merged bit column select and redundancy steering multiplexers 210.

As shown in FIG. 2B, the select signal generation circuit 220 receives a redundancy steering signal ST and a respective one-hot bit select signal BS, generating the respective select signal input SEL<0:5>, SEL<6:11>, SEL<12:17>, SEL<18:23>, SEL<24:29>, and SEL<30:35>, with the select signal generation logic shown generating the respective select signal input SEL<0:5>, SEL<6:11>. The select signal generation circuit 220 includes a plurality of decoders 222 or demultiplexers 222, each receiving the redundancy steering signal ST to decode a zero or a one. With the redundancy steering signal ST=1, the 0 output of the decoder 222 is decoded or selected and the redundancy steering signal ST=0, the 1 output is decoded. Note that only the SEL signal generation logic 220 for the first two 6 to 1 multiplexers 210 is shown. The SEL signals for the other four 6 to 1 multiplexers 210 is generated in the same manner.

The redundancy steering signal includes one ST signal per bitline column. For example, with bitline columns 0-23, then the redundancy steering signal includes ST <0:23>, and with a bad bitline column 4 being the column that needs to be steered around, ST<5:23> are 0s and ST<0:4> are 1s. The one-hot bit select signal includes, for example, BS<0:3> with a bit decode 4 implementation.

Each of the plurality of decoders 222 or demultiplexers 222 is implemented with a 1 to 2 decoder or demultiplexer. The decoders 222 can be implemented with any standard type of demultiplexer. In many SRAMs, a CMOS multiplexer would be used to implement the demultiplexers 222.

Figure 3B:
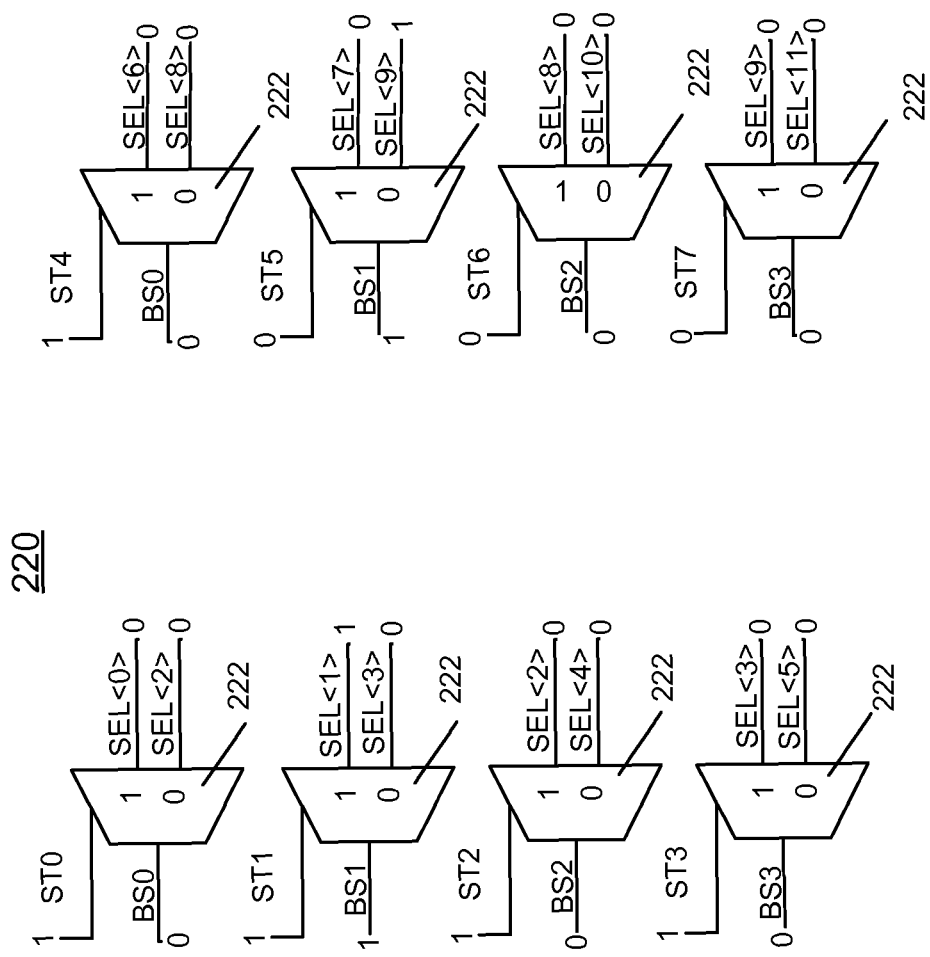

FIGS. 3A and 3B illustrate the exemplary SRAM circuit 200 of FIGS. 2A and 2B in accordance with a preferred embodiment showing an example steering operation by providing example added data values and paths. As shown, with a bad bitline column 4 being the column that needs to be steered around, ST<5:23> are 0s and ST<0:4> are 1s. The one-hot bit select signal includes, for example, BS<0:3> with a bit decode 4 implementation. In FIG. 3A, paths from the SRAM core are shown in dotted line, and example data values are added in FIG. 2B to the select signal generation circuit 220.

In the illustrated example, the bitline column 204, #4 is determined to be bad and must be steered around. This means that the input signal ST<0:23>=111110000000000000000000. The example shown is a read of bit 1 of each data bit and as such BS<0:3>=0100. The bitline paths that are passed by the 6 to 1 multiplexers in this case are shown in dotted line.

FIG. 4 shows a block diagram of an example design flow 400. Design flow 400 may vary depending on the type of IC being designed. For example, a design flow 400 for building an application specific IC (ASIC) may differ from a design flow 400 for designing a standard component. Design structure 402 is preferably an input to a design process 404 and may come from an IP provider, a core developer, or other design company or may be generated by the operator of the design flow, or from other sources. Design structure 402 comprises circuits 200, 220 in the form of schematics or HDL, a hardware-description language, for example, Verilog, VHDL, C, and the like. Design structure 402 may be contained on one or more machine readable medium. For example, design structure 402 may be a text file or a graphical representation of circuits 200, 220. Design process 404 preferably synthesizes, or translates, circuit 100 into a netlist 406, where netlist 406 is, for example, a list of wires, transistors, logic gates, control circuits, I/O, models, etc. that describes the connections to other elements and circuits in an integrated circuit design and recorded on at least one of machine readable medium. This may be an iterative process in which netlist 406 is resynthesized one or more times depending on design specifications and parameters for the circuits.

Design process 404 may include using a variety of inputs; for example, inputs from library elements 404 which may house a set of commonly used elements, circuits, and devices, including models, layouts, and symbolic representations, for a given manufacturing technology, such as different technology nodes, 42 nm, 45 nm, 90 nm, and the like, design specifications 410, characterization data 412, verification data 414, design rules 416, and test data files 414, which may include test patterns and other testing information. Design process 404 may further include, for example, standard circuit design processes such as timing analysis, verification, design rule checking, place and route operations, and the like. One of ordinary skill in the art of integrated circuit design can appreciate the extent of possible electronic design automation tools and applications used in design process 404 without deviating from the scope and spirit of the invention. The design structure of the invention is not limited to any specific design flow.

Design process 404 preferably translates an embodiment of the invention as shown in FIGS. 2A, and 2B along with any additional integrated circuit design or data (if applicable), into a second design structure 420. Design structure 420 resides on a storage medium in a data format used for the exchange of layout data of integrated circuits, for example, information stored in a GDSII (GDS2), GL1, OASIS, or any other suitable format for storing such design structures. Design structure 420 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 2A, and 2B. Design structure 420 may then proceed to a stage 422 where, for example, design structure 420 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A method for implementing single bit redundancy with a dynamic Static Random Access Memory (SRAM) circuit and any bit decode comprising:
   providing a series of merged bit column select and redundancy steering multiplexers; each of said merged bit column select and redundancy steering multiplexers having a plurality of inputs and one output;
   connecting each of a plurality of bitline columns and a pair of redundancy columns to a respective input of said series of said merged bit column select and redundancy steering multiplexers with an adjacent pair of bitline columns connected to a respective adjacent pair of inputs of a next adjacent one of said series of merged bit column select and redundancy steering multiplexers;
   applying a respective select signal input to control each of said merged bit column select and redundancy steering multiplexers;
   applying a redundancy steering signal and a respective one-hot bit select signal to select signal generation logic, generating the respective select signal input.

2. The method as recited in claim 1 includes providing only the pair of redundancy columns for different bit decodes, where the bit decode is a selected N to 1 multiplexer, where N is greater than 2.

3. The method as recited in claim 1 wherein the redundancy steering signal and the respective one-hot bit select signal are external applied signals.

4. The method as recited in claim 1 wherein the redundancy steering signal includes one ST signal per bitline column.

5. The method as recited in claim 4 wherein the redundancy steering signal ST includes ST<0:23> with bitline columns 0-23.

6. The method as recited in claim 1 includes implementing the select signal generation logic with a plurality of 1:2 decoders, each 1:2 decoder receiving the respective one-hot bit select signal input and receiving the redundancy steering signal ST to select a zero or a one.

7. A dynamic Static Random Access Memory (SRAM) circuit for implementing single bit redundancy with any bit decode comprising:
   a series of merged bit column select and redundancy steering multiplexers; each of said merged bit column select and redundancy steering multiplexers having a plurality of inputs and one output;
   each of a plurality of bitline columns and a pair of redundancy columns connected to a respective input of said series of said merged bit column select and redundancy steering multiplexers with an adjacent pair of bitline columns connected to a respective adjacent pair of inputs of a next adjacent one of said series of merged bit column select and redundancy steering multiplexers;
   a respective select signal input applied to control each said merged bit column select and redundancy steering multiplexer; and
   select signal generation logic receiving a redundancy steering signal and a respective one-hot bit select signal, generating the respective select signal input.

8. The dynamic SRAM circuit as recited in claim 7 wherein said select signal generation logic includes a plurality of demultiplexers, each receiving a redundancy steering signal and a respective one-hot bit select signal.

9. The dynamic SRAM circuit as recited in claim 8 wherein said plurality of demultiplexers includes 1:2 decoder.

10. The dynamic SRAM circuit as recited in claim 7 wherein the redundancy steering signal and the respective one-hot bit select signal are external applied signals.

11. The dynamic SRAM circuit as recited in claim 7 includes only the pair of redundancy columns with different bit decodes, where the bit decode is a selected N to 1 multiplexer, where N is greater than 2.

12. The dynamic SRAM circuit as recited in claim 7 wherein the redundancy steering signal includes one ST signal per bitline column.

13. The dynamic SRAM circuit as recited in claim 7 wherein the redundancy steering signal ST includes ST<0:23> with bitline columns 0-23.

14. The dynamic SRAM circuit as recited in claim 13 wherein the select signal generation logic with a plurality of 2:1 demultiplexers, each 2:1 demultiplexer receiving the respective one-hot bit select signal input and receiving the redundancy steering signal ST to select a zero or a one.

15. A design structure embodied in a non-transitory machine readable medium used in a design process, the design structure comprising:
   a dynamic Static Random Access Memory (SRAM) circuit tangibly embodied in the machine readable medium used in the design process, said dynamic SRAM circuit for implementing single bit redundancy with any bit decode, said dynamic SRAM circuit comprising:
   a series of merged bit column select and redundancy steering multiplexers; each of said merged bit column select and redundancy steering multiplexers having a plurality of inputs and one output;
   each of a plurality of bitline columns and a pair of redundancy columns connected to a respective input of said series of said merged bit column select and redundancy steering multiplexers with an adjacent pair of bitline columns connected to a respective adjacent pair of inputs of a next adjacent one of said series of merged bit column select and redundancy steering multiplexers;
   a respective select signal input applied to control each said merged bit column select and redundancy steering multiplexer; and
   select signal generation logic receiving a redundancy steering signal and a respective one-hot bit select signal, generating the respective select signal input, wherein the design structure, when read and used in the manufacture of a semiconductor chip produces a chip comprising said dynamic SRAM circuit.

16. The design structure of claim 15, wherein the design structure comprises a netlist, which describes said dynamic SRAM circuit.

17. The design structure of claim 15, wherein the design structure resides on storage medium as a data format used for the exchange of layout data of integrated circuits.

18. The design structure of claim 15, wherein the design structure includes at least one of test data files, characterization data, verification data, or design specifications.

19. The design structure of claim 15, wherein said select signal generation logic includes a plurality of multiplexers, each receiving a redundancy steering signal and a respective one-hot bit select signal.

20. The design structure of claim 15, the redundancy steering signal and the respective one-hot bit select signal are external applied signals.

* * * * *